(12) United States Patent
Shih et al.

(10) Patent No.: US 6,469,562 B1
(45) Date of Patent: Oct. 22, 2002

(54) SOURCE FOLLOWER WITH VGS COMPENSATION

(76) Inventors: Jun-Ren Shih, No. 305, Sec. 2, ChangShui Rd. HsiuShui Hsiang, ChangHua (TW); Shang-Li Chen, 4F, No. 62, ChinCheng 1 Rd., Tung Distict, Hsinchu (TW); Bowen Wang, No.4, Alv.6, Ln 16, TungHsing St., ShuLin, Taipei (TW)

(*) Notice: Subject to any disclaimer, the term of this patent is extended or adjusted under 35 U.S.C. 154(b) by 0 days.

(21) Appl. No.: 09/603,210

(22) Filed: Jun. 26, 2000

(51) Int. Cl.[7] ................................................ G06G 7/12
(52) U.S. Cl. ......................... 327/362; 327/307; 327/374
(58) Field of Search ................................ 327/362, 363, 327/108, 109, 110, 111, 112, 306, 307, 427, 538, 540, 541, 542, 543, 575, 581, 374; 326/82, 83

(56) References Cited

U.S. PATENT DOCUMENTS

| | | | | |
|---|---|---|---|---|
| 4,698,526 A | * | 10/1987 | Allan | 326/71 |
| 4,968,904 A | * | 11/1990 | Yamashita et al. | 326/83 |
| 5,399,989 A | * | 3/1995 | Chern | 330/254 |
| 5,457,433 A | * | 10/1995 | Westwick | 331/116 FE |
| 5,469,085 A | * | 11/1995 | Shibata et al. | 326/121 |
| 5,512,814 A | * | 4/1996 | Allman | 323/267 |
| 5,748,019 A | * | 5/1998 | Wong et al. | 327/170 |
| 5,869,993 A | * | 2/1999 | Vorenkamp | 327/317 |
| 5,912,483 A | * | 6/1999 | Hamada | 257/239 |
| 5,994,942 A | * | 11/1999 | Itoh | 327/309 |
| 6,225,616 B1 | * | 5/2002 | Park | 250/208.1 |

* cited by examiner

Primary Examiner—Timothy P. Callahan
Assistant Examiner—Hai L. Nguyen (57) ABSTRACT

Disclosed is a source follower with Vgs compensation, such that the output voltage precisely follows the input voltage by various arrangements of MOSFET's, switches, and capacitors. In addition, such a source follower that the output voltage precisely follows the input voltage can be implemented without adding too many components. The source follower disclosed in the present invention can be used in the driver circuit for a liquid crystal display (LCD).

13 Claims, 8 Drawing Sheets

SOURCE FOLLOWER WITH VGS COMPENSATION

BACKGROUND OF THE INVENTION

1. Field of the Invention

The present invention generally relates to a source follower with Vgs compensation, and more particularly, to a source follower such that the output voltage precisely follows the input voltage by various arrangements of metal-oxide-semiconductor transistors (to be abbreviated as MOSFET's hereinafter), switches, and capacitors.

2. Description of the Prior Art

The technique in the field of displays has grown rapidly due to the fast development in opto-electronics. However, for a thin film transistor-liquid crystal display (to be abbreviated as TFT-LCD hereinafter), the implementation of the driving circuit for such a display has been a key technique. To more specific, the circuit design for source follower implementation has a lot to be improved.

Figure 1B:
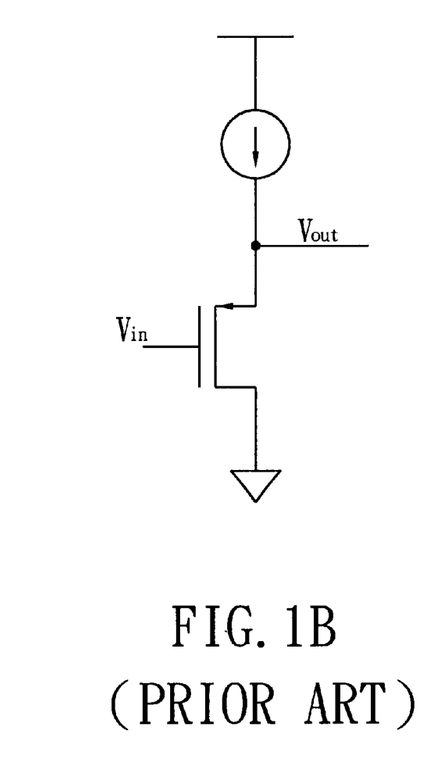
FIG. 1B is a schematic circuit diagram of the conventional source follower in the prior art, utilizing a different type of MOSFET relative to the source follower as shown in FIG. 1A.

Please refer to FIG. 1A, which shows a conventional source follower circuit, wherein a single n-MOSFET is provided with the drain terminal connected to a constant voltage source, the gate terminal receiving an input voltage and the source terminal outputting an output voltage. Since the bias current that flows through such a MOSFET is fixed, in other words, the current I is a constant, the voltage across the gate terminal and the source terminal, Vgs, is kept fixed. Therefore, as the gate terminal is applied with an input voltage Vin, the source voltage Vout is determined from inspection of the circuit to be Vout=Vin−Vgs. Similarly, as shown in FIG. 1B, a single p-MOSFET is provided with the drain terminal connected to a constant voltage source, the gate terminal receiving an input voltage and the source terminal outputting an output voltage. Therefore, as the gate terminal is applied with an input voltage Vin, the source voltage Vout is determined from inspection of the circuit to be Vout=Vin−Vgs.

Nevertheless, such a circuit configuration suffers from the problems in that (1) there exists a difference value of Vgs between Vout and Vin, (2) MOSFET's at different positions have different threshold voltages, Vt, because there are a lot of buffers used in a large area, leading to a varying Vgs due to the relation Vgs=Vt+ΔV, wherein ΔV denotes a voltage variation, resulting in inaccuracy and poor uniformity, and (3) Vout varies with Vin as the change in Vds leads to the change in Vgs. In brief, Vout=Vin−Vgs−ΔVgs. Accordingly, Vout varies with ΔVgs (dVgs is about 50 mV when Vin is from 0 to 10 V.) In operation, such a circuit configuration can serve as a data driver when speed is concerned, however, it still has a lot to be improved when precision is taken into account.

The prior art technique can be exemplified by, for example, "16.4 A Low-Power Poly-Si TFT-LCD with Integrated 8-bit Digital Data Drivers", SID 1998, "High Performance, Low-Power Integrated 8-bit Digital Data Driver for Poly-Si TFT-LCD", SID 1999, and "A Novel Integrated Serial Data Driver Poly-Si TFT-LCD's", ED 1999. All of these articles were completed by the group conducted by Seung-Woo Lee at Taejon University, Korea.

Figure 2A:
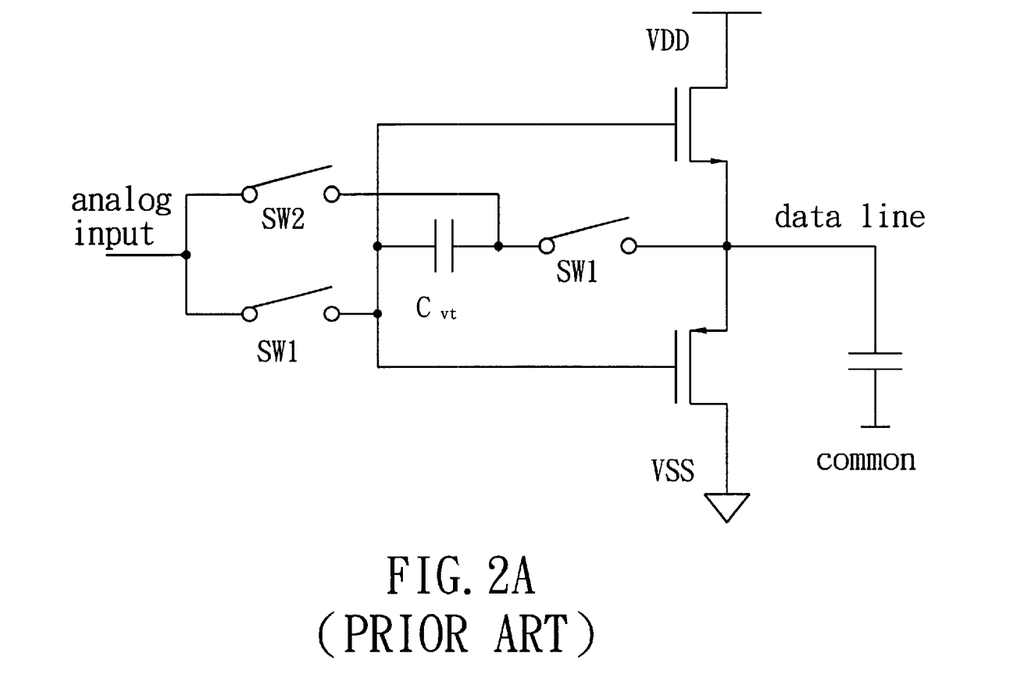
FIG. 2A is a schematic circuit diagram of the conventional source follower in the prior art.
Figure 2B:
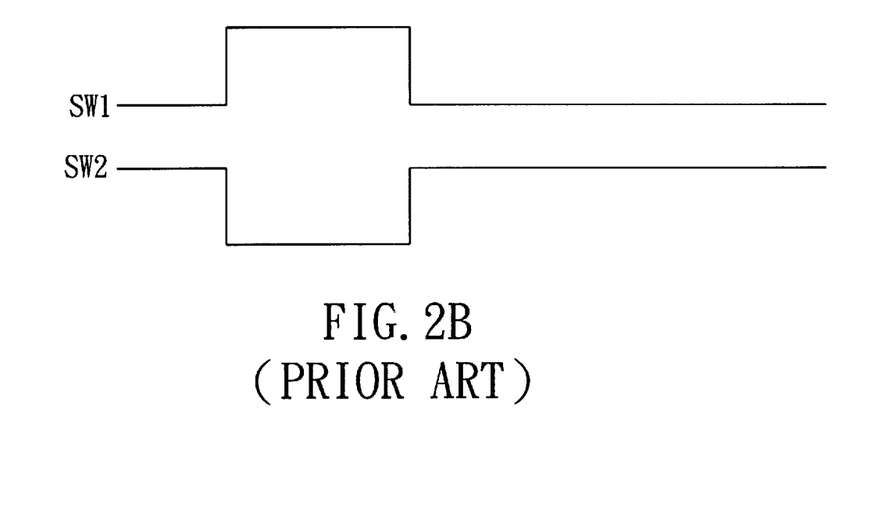
FIG. 2B is a switching waveform diagram for the switches according to FIG. 2A.

For the key points disclosed in the above three articles, please refer to FIG. 2A and FIG. 2B, wherein FIG. 2A shows the circuit configuration of a digital data driver in the prior art and FIG. 2B shows a switching waveform diagram for the switches according to FIG. 2A. If the output voltage is in the ranges from 0 to 5 V and from 5 to 10 V, there are provided an n-MOSFET in charge of the range from 5 to 10 V and a p-MOSFET in charge of the range from 0 to 5 V. For each input data, only one of n-MOSFET and p-MOSFET operates in the saturation region and the other is cut off. Furthermore, the initial values of the input voltage and output voltage determine which MOSFET to operate in the saturation region.

From inspection of the circuit as shown in FIG. 2A, if the analog input voltage is larger than the data line voltage, then the n-MOSFET is in the saturation region and the p-MOSFET is cut off; however, if the analog input voltage is smaller than the data line voltage, then the p-MOSFET is in the saturation region and the n-MOSFET is cut off.

Please refer to FIG. 2B, which shows a waveform diagram for the switches SW1's and SW2. The operation principle of the circuit shown in FIG. 2A can be explained with the waveform diagram shown in FIG. 2A. Please further refer to FIG. 3A and FIG. 3B, wherein the two SW1's are ON and the SW2 is OFF for the circuit shown in FIG. 3A, and the two SW1's are OFF and the SW2 is ON for the circuit shown in FIG. 3B. When the two SW1's are ON, the SW2 is OFF, the analog input voltage is assumed to be in the range from 5 to 10 V, and the data line voltage is in the range from 0 to 5 V, then the analog input voltage is larger than the data line voltage, causing the n-MOSFET to be ON and the data line voltage to increase until Vgs=Vnth, the threshold voltage of the n-MOSFET. Meanwhile, the n-MOSFET is almost cut off, the storage voltage across the capacitor Cvt is Vnth, and the data line voltage is Vin−Vnth. After the capacitor Cvt has stored a voltage of Vnth, the two SW1's are cut OFF and the SW2 turns ON, and the DAC voltage remains unchanged. Meanwhile, since the capacitor Cvt has stored a voltage of Vnth, the gate voltage of the n-MOSFET becomes Vin+Vnth, causing the n-MOSFET to operate in the saturation region and the data line voltage to increase until it reaches Vin.

Accordingly, it is obvious that, regardless of the Vth value, the final voltage on the data line approaches the output voltage Vin of the DAC, such that the problem that the threshold voltage varies can be overcome. However, such a circuit still has two major disadvantages to be improved, wherein (1) the circuit is modified by storing a voltage equal to the threshold voltage, however, the threshold voltage is not constant but varies with the current in the sub-threshold region, and it takes a long time for the threshold voltage to become stable; and (2) in operation, there is formed a "dead zone", in which both of the two MOSFET's are cut off when the variation of the input voltage Vin is smaller than |Vth|.

Figure 3A:
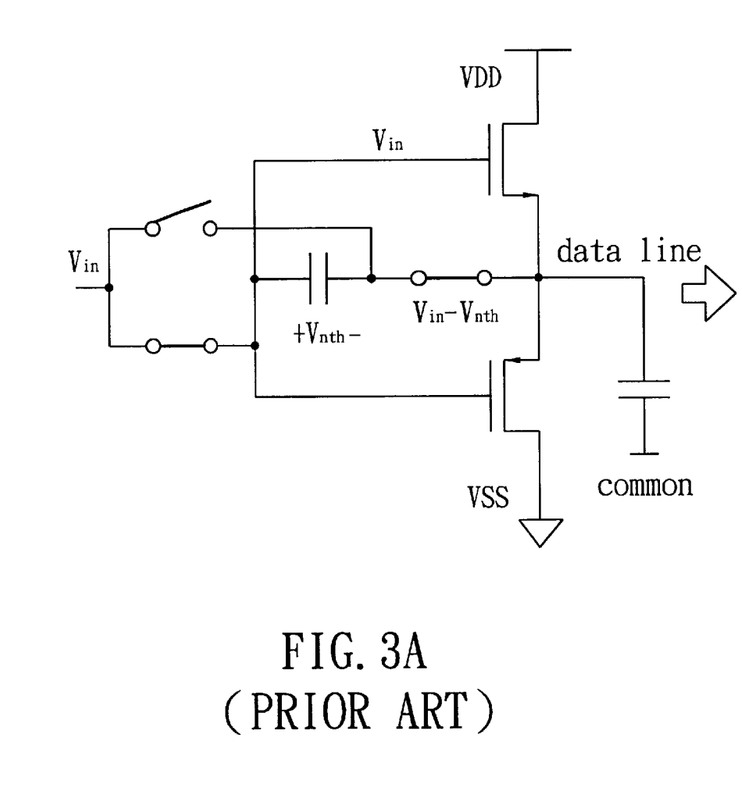
FIG. 3A is a schematic circuit diagram illustrating a first operation mode of the conventional source follower according to FIG. 2A.

In addition, the operational feasibility of the circuit as shown in FIG. 3A has been examined by simulation. It has been found that, for different values of Vds, the corresponding Id-Vgs curves differ. As a result, Vout can not approach a final value. Furthermore, if the charging process lasts long enough, Vout may even exceed Vin and operate in the linear region. Such a circuit suffers from considerable inaccuracy and is not suitable for high-resolution applications. Consequently, there is a need for improved driving circuit.

SUMMARY OF THE INVENTION

In order to overcome the above problems, it is the primary object of the present invention to provide a source follower with Vgs compensation, such that the output voltage precisely follows the input voltage by various arrangements of MOSFET's, switches, and capacitors. In addition, the output voltage of said source follower is equal to the input voltage of said source follower, without adding too many components to the circuit.

In order to accomplish the foregoing object, the present invention provides a source follower with Vgs compensation, comprising: a complementary MOS (to be abbreviated as CMOS below) circuit composed of a MOSFET M1 and a MOSFET M2, with the gate terminal of said MOSFET M1 connected to an input voltage Vin and the gate terminal of said MOSFET M2 connected to a capacitor C and a first switch SW1, wherein the other terminal of said first switch SW1 is connected to a constant current source and the source terminal of said MOSFET M1; and a capacitor C, with one terminal of said capacitor C connected between the gate terminal of said MOSFET M2 and said first switch SW1, and the other terminal connected between a second switch SW2 and the other first switch SW1, wherein the other terminal of said second switch SW2 is connected to an input voltage Vin and the other terminal of said the other first switch SW1 is connected to a constant current source, the source terminal of said MOSFET M2 and the load to provide a output voltage of Vout.

It is preferable that the circuit with the arrangement of said CMOS circuit, switches and capacitor can operate in Phase 1 mode (at time t1), wherein the voltage level starting from the input voltage Vin obtains a voltage rise of |Vgs| through said MOSFET M1 and then obtains a voltage drop of Vgs2 through said MOSFET M2, resulting in a gate voltage of said MOSFET M1 being equal to Vin+|Vgs1(t1)| and a voltage across the two terminals of said capacitor being equal to Vgs2(t1) of said MOSFET M2.

It is preferable that the circuit with the arrangement of said CMOS circuit, switches and capacitor can operate in Phase 2 mode (at time t2), wherein the input voltage is connected to one terminal of said capacitor, resulting in a gate voltage of said MOSFET M2 being equal to Vin+|Vgs2(t1)| and an output voltage Vout being equal to Vin+|Vgs2(t1)|−|Vgs2(t2)|, which is very close to Vin.

It is preferable that said CMOS circuit can be implemented by using a p-MOSFET as said MOSFET M1 and an n-MOSFET as said MOSFET M2.

It is preferable that said CMOS circuit can also be implemented by using an n-MOSFET as said MOSFET M1 and a p-MOSFET as said MOSFET M2.

BRIEF DESCRIPTION OF THE DRAWINGS

The objects, spirits and advantages of the preferred embodiment of the present invention will be readily understood by the accompanying drawings and detailed descriptions, wherein:

FIG. 1A is a schematic circuit diagram of the conventional source follower in the prior art;

FIG. 5A is a schematic circuit diagram illustrating a source follower operating in Phase 2 mode in accordance with the first embodiment of the present invention;

DETAILED DESCRIPTION OF THE INVENTION

The present invention provides a source follower with Vgs compensation, such that the output voltage precisely follows the input voltage by various arrangements of MOSFET's, switches, and capacitors. In addition, the output voltage of said source follower is equal to the input voltage of said source follower, without adding too many components to the circuit.

Figure 4A:
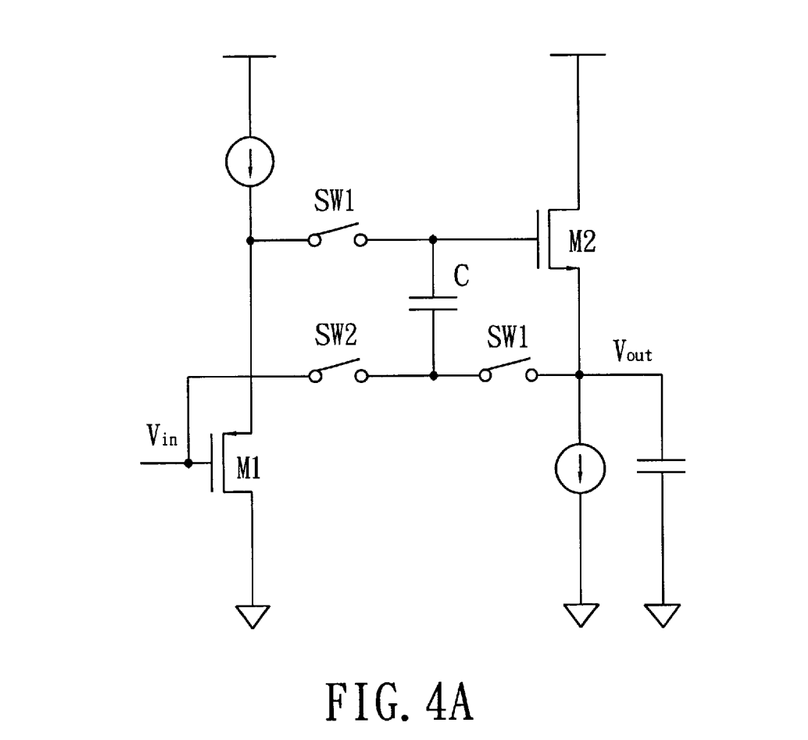
FIG. 4A is a schematic circuit diagram of a source follower in accordance with the first embodiment of the present invention.
Figure 4B:
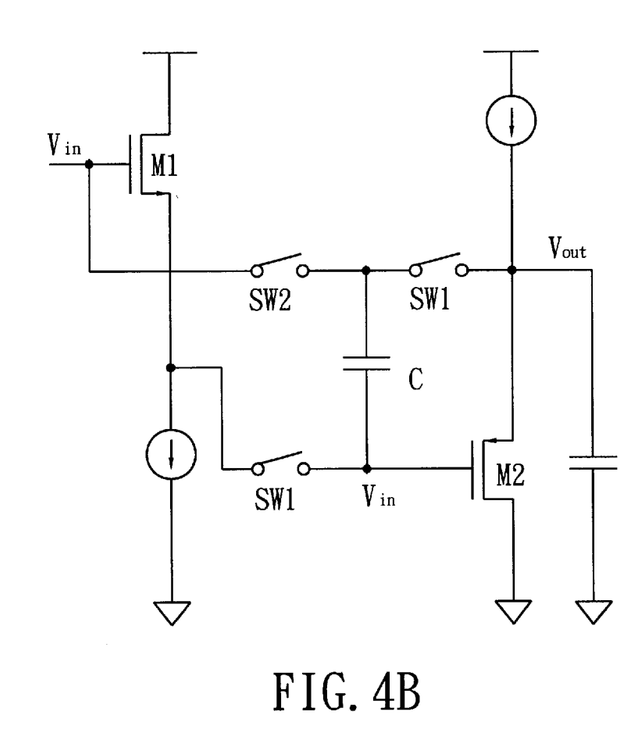
FIG. 4B is a schematic circuit diagram of a source follower utilizing a different type of CMOS circuit in accordance with the first embodiment of the present invention.

For the key points disclosed in the present invention, please refer to FIG. 4A and FIG. 4B, wherein FIG. 4A is a schematic circuit diagram of a source follower featuring a p-MOSFET connected to the input terminal and FIG. 4B is a schematic circuit diagram of a source follower featuring an n-MOSFET connected to the input terminal in accordance with the first embodiment of the present invention. As shown in FIG. 4A, said source follower comprises: a CMOS circuit composed of a MOSFET M1 and a MOSFET M2, with the gate terminal of said MOSFET M1 connected to an input voltage Vin and the gate terminal of said MOSFET M2 connected to a capacitor C and a first switch SW1, wherein the other terminal of said first switch SW1 is connected to a constant current source and the source terminal of said MOSFET M1. Moreover, one terminal of said capacitor C is connected between the gate terminal of said MOSFET M2 and said first switch SW1, and the other terminal is connected between a second switch SW2 and the other first switch SW1, wherein the other terminal of said second switch SW2 is connected to an input voltage Vin and the other terminal of said the other first switch SW1 is connected to a constant current source, the source terminal of said MOSFET M2 and the load to provide a output voltage of Vout.

Moreover, as shown in FIG. 4A, said CMOS circuit can be implemented by using a p-MOSFET as said MOSFET M1 and an n-MOSFET as said MOSFET M2; however, as shown in FIG. 4B, said CMOS circuit can be implemented by using an n-MOSFET as said MOSFET M1 and a p-MOSFET as said MOSFET M2.

Figure 5A:
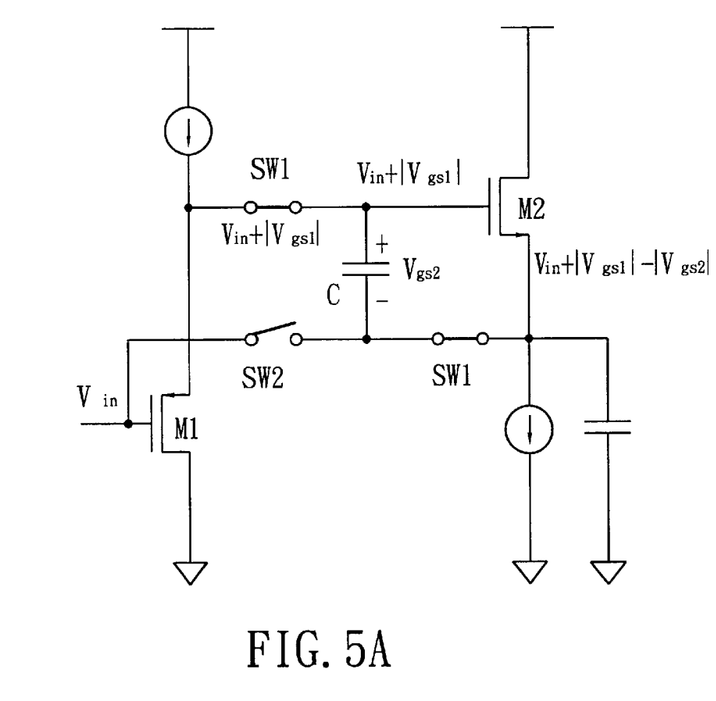
FIG. 5A is a schematic circuit diagram illustrating a source follower operating in Phase 1 mode in accordance with the first embodiment of the present invention.
Figure 5B:
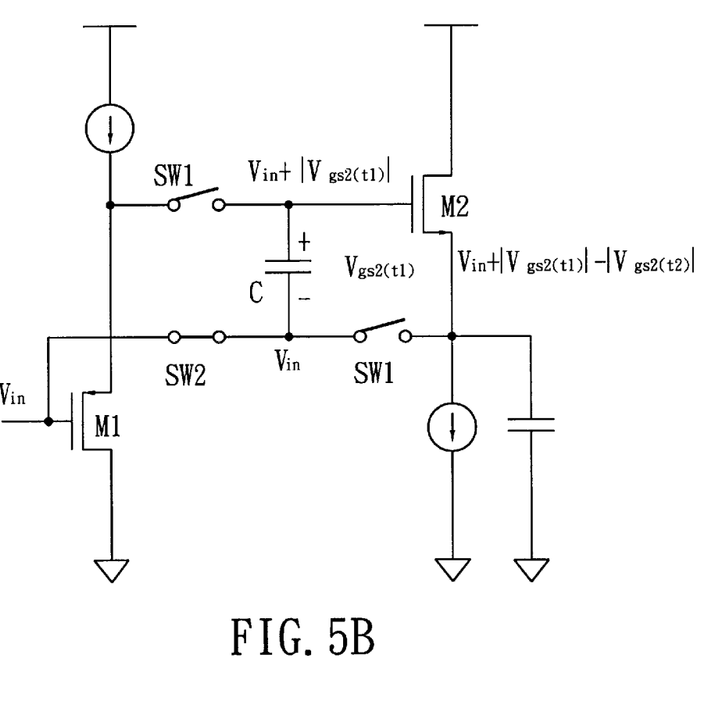

The operation of the circuit shown in FIG. 4A includes Phase 1 mode and Phase 2 mode, as shown in FIG. 5A and FIG. 5B, wherein FIG. 5A is a schematic circuit diagram illustrating a source follower operating in Phase 1 mode in accordance with the first embodiment of the present invention. In Phase 1 mode, the voltage level starting from the input voltage Vin obtains a voltage rise of |Vgs1| through said MOSFET M1 and then obtains a voltage drop of Vgs2 through said MOSFET M2, resulting in a gate voltage of said MOSFET M1 being equal to Vin+|Vgs1(t1)| and a voltage across the two terminals of said capacitor being equal to Vgs2(t1) of said MOSFET M2.

In addition, please refer to FIG. 5B, which is a schematic circuit diagram illustrating a source follower operating in Phase 2 mode in accordance with the first embodiment of the present invention. In Phase 2 mode, the input voltage is connected to one terminal of said capacitor, resulting in a gate voltage of said MOSFET M2 being equal to Vin+|Vgs2(t1)| and an output voltage Vout being equal to Vin+|Vgs2(t1)|−|Vgs2(t2)|, which is very close to Vin.

Figure 3B:
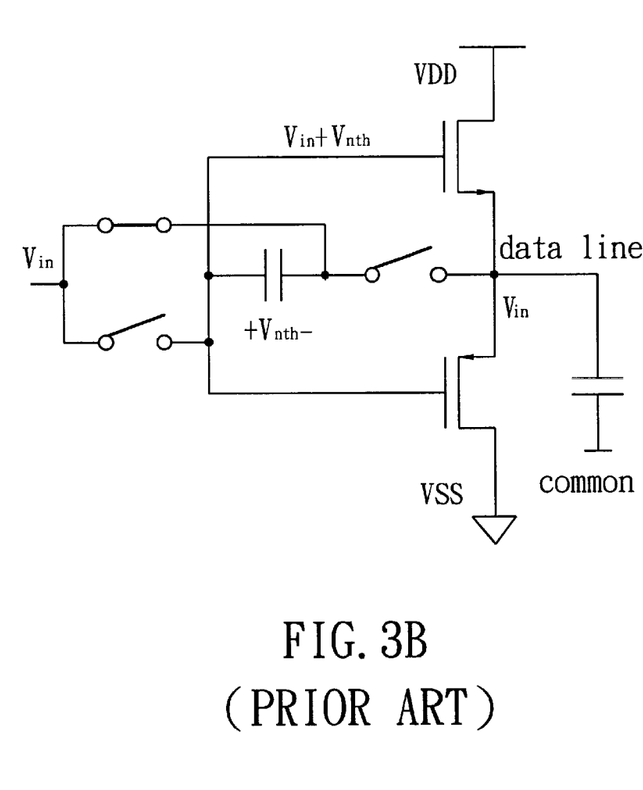
FIG. 3B is a schematic circuit diagram illustrating a second operation mode of the conventional source follower according to FIG. 2A.

The reasons why the circuit configurations disclosed in FIGS. 4A, 4B, 5A and 5B have better precision than the conventional circuits shown in FIG. 3A and FIG. 3B include:

a. In the circuit configurations disclosed in the present invention, there is provided a constant current source such that the MOSFET's always operate in the saturation region and have a stable Vgs, instead of operating in the linear region such that the Vgs can not be precisely controlled and may adversely affect the operation speed.

b. Vg stays constant at t1 (for Phase 1 mode) and t2 (for Phase 2 mode), therefore Vgs is a constant, so as to improve the inaccuracy due to the variation of Vgs (as a result of the variation of Vg) and meet the requirement for high-resolution applications.

Moreover, it is also noted that the variation of Vgs is caused by the variation of the gate voltage of said MOSFET M2 with the input voltage, i.e., $Vg2(t1)=Vin+|Vgs1(t1)|$ $Vg2(t2)=Vin+|Vgs2(t1)|$ Therefore, Vs varies with Vg and Vgs varies with Vds.

Furthermore, the variation of the threshold voltage Vt must be taken into account for the circuit configurations disclosed in the present invention. There is a voltage drop Vsb between the body and the source terminal, which enlarges the threshold voltage, known as the body effect. Let us review the relations for the circuit configurations disclosed in the present invention, $Vg2(t1)=Vin+|Vgs1(t1)|$ $Vg2(t2)=Vin+|Vgs2(t1)|$ Considering said MOSFET M1 with the body connected to Vdd, i.e. exhibiting the body effect, we find that |Vgs1(t1)| decreases with a decreasing Vsb when the input voltage increases. Meanwhile, said MOSFET M2 has the body connected to ground, such that |Vgs2(t1)| increases with an increasing Vsb when the source voltage increases, resulting a large variation of Vg2. That makes Vgs2 vary greatly at t1 and t2 and leads to inaccuracy. Practically, when the fabrication provided by TSMC (Taiwan) or UMC (Taiwan) on a silicon wafer is used, the body and the source terminal must be connected though an isolated well, such that Vsb=0 and the threshold voltage Vt becomes constant. In addition, if the LT-poly process is used, each MOSFET is isolated and becomes free of the body effect.

Furthermore, the circuit configurations disclosed in the present invention have been simulated by using the umc.35_2p3m_hv model, with the source and the body of the source follower being connected, so as to eliminate the body effect. It has been found that a deviation of about 5 mV due to the variation of Vgs can be reduced. The remaining deviation caused by the switches is now limited within 5 mV. It is believed that the circuit configurations disclosed in the present invention can be further improved by using controlled clock feed-through and charge injection techniques.

Figure 6A:
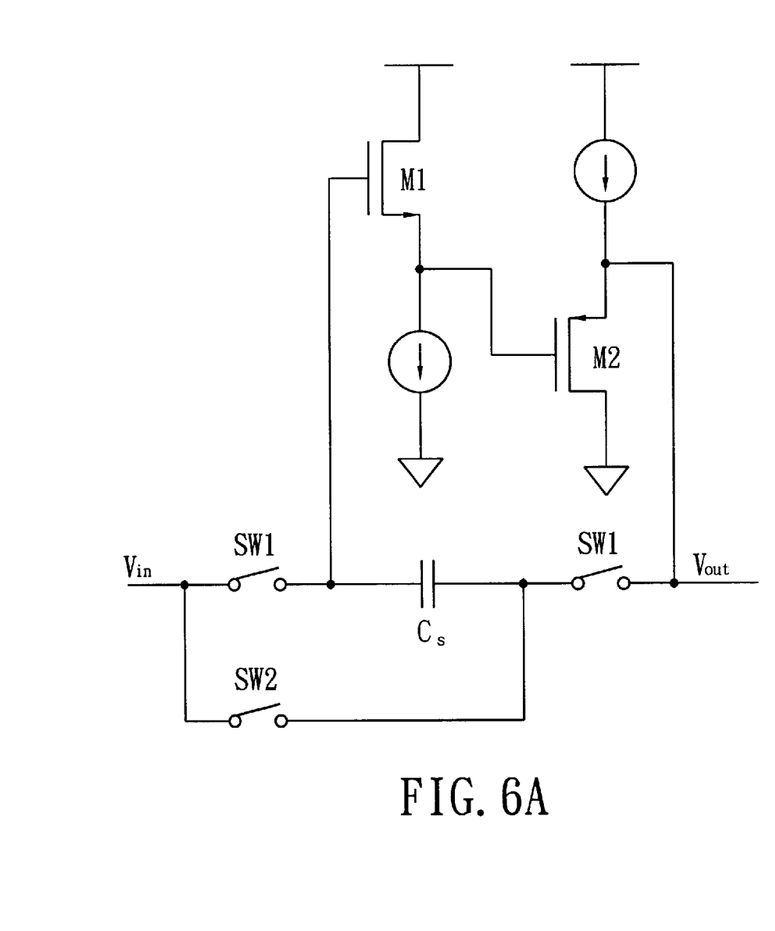
FIG. 6A is a schematic circuit diagram of a source follower in accordance with the second embodiment of the present invention.

Please refer to FIG. 6A, which is a schematic circuit diagram of a source follower in accordance with the second embodiment of the present invention. Said source follower is a source follower with Vgs compensation and offset voltage cancellation, which comprises: a CMOS circuit composed of a MOSFET M1 and a MOSFET M2, with the gate terminal of said MOSFET M1 connected to a capacitor Cs and a first switch SW1, wherein the other terminal of said first switch SW1 is connected to an input voltage Vin and a second switch SW2, and the source terminal of said MOSFET M1 is connected to a constant current source and the gate terminal of said MOSFET M2, wherein the source of said MOSFET M2 is also connected to a constant current source and the load to provide a output voltage Vout. Moreover, one terminal of said capacitor Cs is connected to said first switch SW1, and the other terminal is connected between a second switch SW2 and the other first switch SW1.

The operation principle of the circuit shown in FIG. 6A is based on the storage of the difference between the input voltage Vin and the output voltage Vout on said capacitor Cs, so as to add the difference as compensation in the next phase. Vgs1 can be set to be close to Vgs2, such that the variation of Vg1 can be reduced, so as to make the conditions in Phase 1 and Phase 2 nearly identical.

The operation of the circuit shown in FIG. 6A includes Phase 1 mode and Phase 2 mode. In Phase 1 mode, the voltage level starting from the input voltage Vin obtains a voltage drop of Vgs1 through said MOSFET M1 and then obtains a voltage rise of Vgs2 through said MOSFET M2, resulting in an output voltage $Vout=Vin+|Vgs1(t1)|+|Vgs2(t1)|$ and a voltage across the two terminals of said capacitor $VCs=|Vgs1(t1)|-|Vgs2(t1)|.$ Moreover, in Phase 2 mode, the input voltage Vin is connected to one terminal of said capacitor Cs, resulting in an output voltage $Vout=Vin+(|Vgs1(t1)|-|Vgs2(t1)|)-|Vgs1(t2)|+|Vgs2(t2)|,$ which is very close to Vin.

Figure 6B:
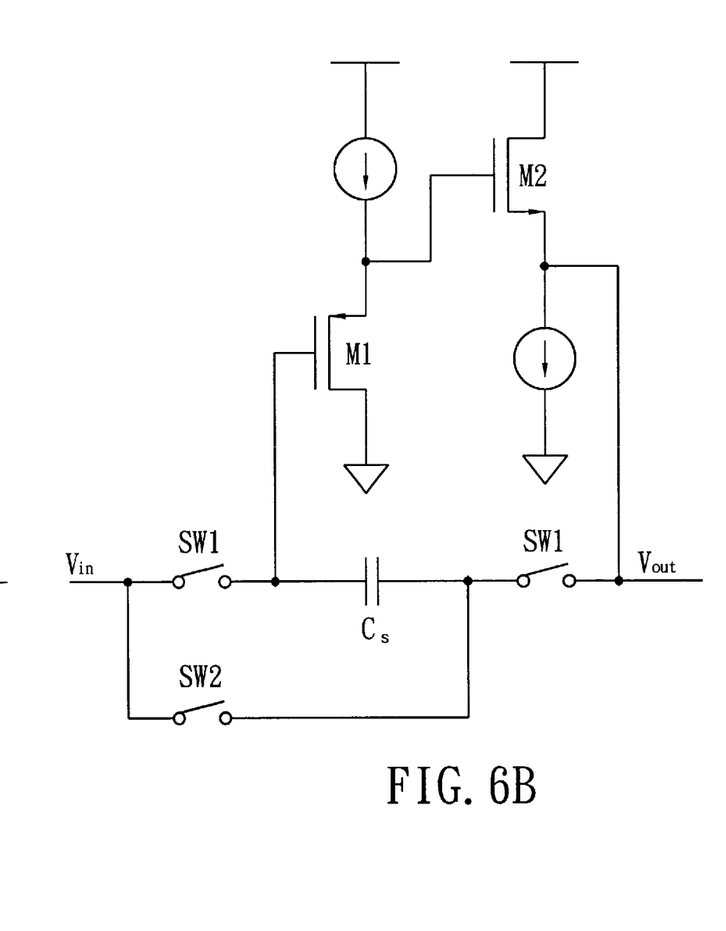
FIG. 6B is a schematic circuit diagram of a source follower utilizing a different type of CMOS circuit in accordance with the second embodiment of the present invention.

As shown in FIG. 6A, said CMOS circuit can be implemented by using an n-MOSFET as said MOSFET M1 and a p-MOSFET as said MOSFET M2; however, as shown in FIG. 6B, which is a schematic circuit diagram of a source follower utilizing a different type of CMOS circuit in accordance with the second embodiment of the present invention, said CMOS circuit can be implemented by using a p-MOSFET as said MOSFET M1 and an n-MOSFET as said MOSFET M2.

Figure 7A:
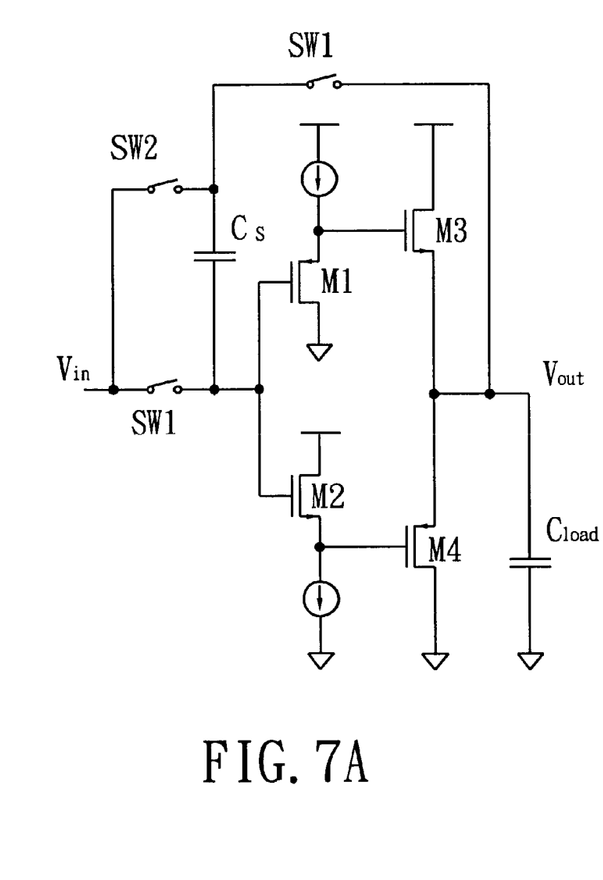
FIG. 7A is a schematic circuit diagram of a source follower in accordance with the third embodiment of the present invention.

Please refer to FIG. 7A, which is a schematic circuit diagram of a source follower in accordance with the third embodiment of the present invention. In the circuit configuration disclosed in FIG. 6A, a constant current source is provided on one side to provide a constant (charging or discharging) current flow. When the current source is placed on the top, the discharging speed is low; however, when the current source is placed on the bottom, the charging speed is low. In order to overcome such an disadvantage, the circuit configuration disclosed in FIG. 6A can be modified to be a push-pull circuit, as shown in FIG. 7A. The operation principle of the circuit configuration disclosed in FIG. 7A is similar to that of the circuit configuration disclosed in FIG. 6A, with MOSFET's M1, M2, M3, and M4 being identical in size.

The source follower disclosed in FIG. 7A is a source follower with Vgs compensation, offset voltage cancellation and enhanced speed, which comprises: a first-stage CMOS circuit composed of a MOSFET M1 and a MOSFET M2, with the gate terminal of said MOSFET M1 connected to the gate terminal of said MOSFET M2, both the source terminals of said MOSFET M1 and said MOSFET M2 connected to a current source respectively, and the common gate terminal further connected to a capacitor Cs and a first switch SW1, wherein the other terminal of said first switch SW1 is connected to an input voltage Vin and a second switch SW2, and the other terminal of said second switch SW2 is connected to the other terminal of said capacitor Cs; a second-stage CMOS circuit composed of a MOSFET M3 and a MOSFET M4, with the source terminal of said MOSFET M3 connected to the source terminal of said MOSFET M4, the gate terminal of said MOSFET M3 connected to the source terminal of said MOSFET M1, the gate terminal of said MOSFET M4 connected to the source terminal of said MOSFET M2, and the common source terminal further connected to the load to provide an output voltage Vout; and the other first switch SW1, connected between said capacitor and said common source terminal, i.e. Vout.

The operation of the circuit shown in FIG. 7A includes Phase 1 mode and Phase 2 mode. In Phase 1 mode, the voltage level starting from the input voltage Vin obtains a voltage rise of Vgs1 through said MOSFET M1 and then obtains a voltage drop of Vgs3 through said MOSFET M3, and the other path results in an output voltage $$Vout=Vin-|Vgs2(t1)|+|Vgs4(t1)|$$

such that the circuit configuration will converge to a value, which is close to Vin. Moreover, in Phase 2 mode, the stored difference between the input voltage Vin and the output voltage Vout on said capacitor Cs in Phase 1 mode is added as compensation, so as to obtain a more precise output voltage, such that the deviation due to the variation of threshold voltage can be eliminated and the output uniformity can thus be improved.

As shown in FIG. 7A, said CMOS circuits can be implemented by using p-MOSFET's as said MOSFET M1 and said MOSFET M4, and n-MOSFET's as said MOSFET M2 and said MOSFET M3.

Figure 7B:
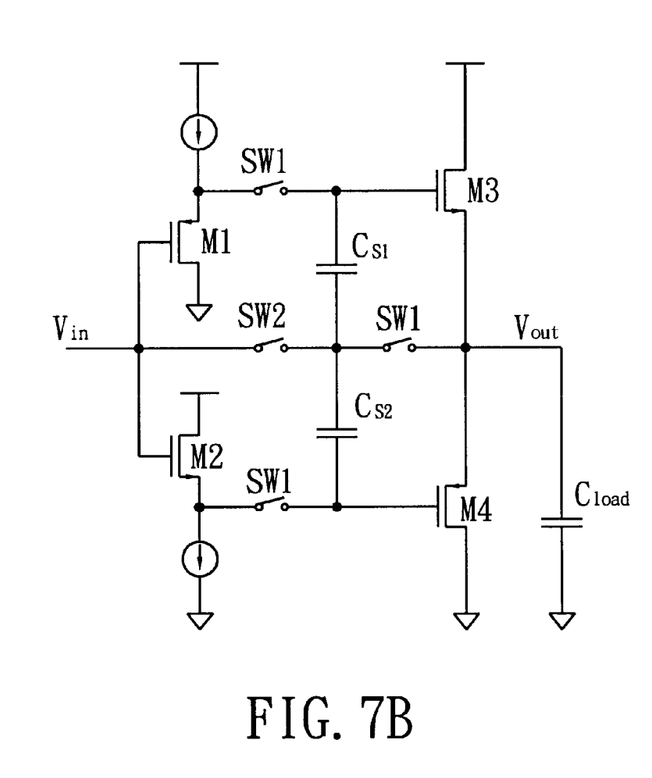
FIG. 7B is a schematic circuit diagram of a source follower utilizing two capacitors in accordance with the third embodiment of the present invention.

Please refer to FIG. 7B, which is a schematic circuit diagram of a source follower utilizing two capacitors in accordance with the third embodiment of the present invention. Said source follower comprises: a first-stage CMOS circuit composed of a MOSFET M1 and a MOSFET M2, with the gate terminal of said MOSFET M1 connected to the gate terminal of said MOSFET M2, both the source terminals of said MOSFET M1 and said MOSFET M2 connected to a current source respectively, and the common gate terminal further connected to the input voltage Vin; a second-stage CMOS circuit composed of a MOSFET M3 and a MOSFET M4, with the source terminal of said MOSFET M3 connected to the source terminal of said MOSFET M4, the gate terminal of said MOSFET M3 connected to a first switch SW1 and a first capacitor Cs1, the gate terminal of said MOSFET M4 connected to a second capacitor Cs2 and the other first switch SW1, and the common source terminal further connected to the load to provide an output voltage Vout, i.e., a first capacitor Cs1 and a second capacitor Cs2 being serially connected between said MOSFET M3 and said MOSFET M4.

Said source follower further comprises a plurality of first switches SW1's, for example, three first switches as shown in FIG. 7B, wherein a first switch S 1 is connected between the source terminal of said MOSFET M1 and the gate terminal of said MOSFET M3, another first switch S1 is connected between the source terminal of said MOSFET M2 and the gate terminal of said MOSFET M4, and the other first switch SW1 is connected between the common terminal of said capacitors Cs1 and Cs2 and the load to provide an output voltage Vout; a second switch SW2, connected between the common terminal of said capacitors Cs1 and Cs2 and the input voltage Vin; and two capacitors Cs1 and Cs2, serially connected between said MOSFET M3 and said MOSFET M4.

Moreover, as shown in FIG. 7B, said CMOS circuits can be implemented by using p-MOSFET's as said MOSFET M1 and said MOSFET M4, and n-MOSFET's as said MOSFET M2 and said MOSFET M3.

Figure 8A:
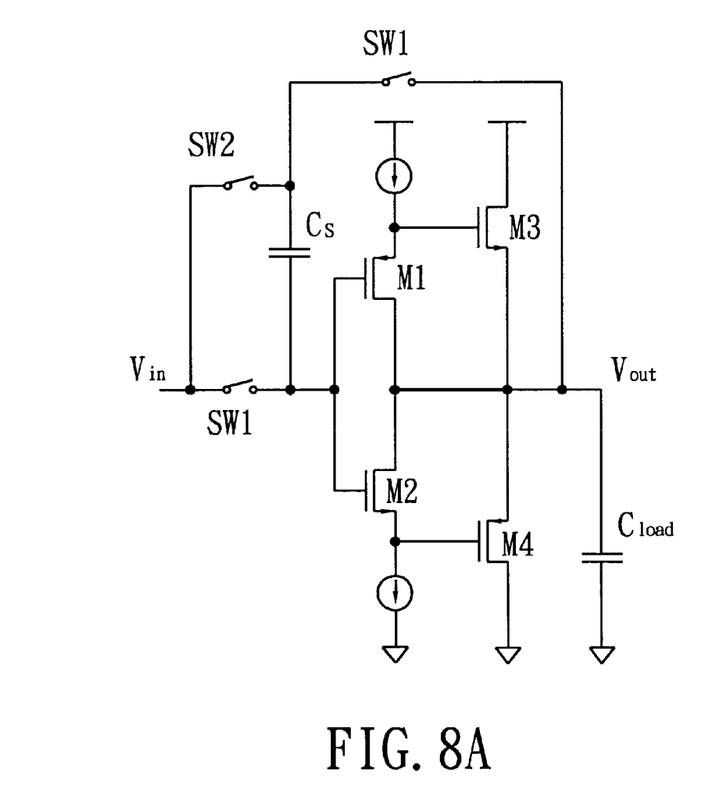
FIG. 8A is a schematic circuit diagram of a source follower in accordance with the fourth embodiment of the present invention.

Please refer to FIG. 8A, which is a schematic circuit diagram of a source follower in accordance with the fourth embodiment of the present invention. Referring to the circuit configuration disclosed in FIG. 7A, we find that the current paths of the first-stage CMOS circuit have been simplified to only one current path, as shown in FIG. 8A, so as to reduce the power consumption. Note the bold feedback loop. Said source follower is a source follower with Vgs compensation, offset voltage cancellation, enhanced speed and low power consumption, which comprises: a first-stage CMOS circuit composed of a MOSFET M1 and a MOSFET M2, with the gate terminal of said MOSFET M1 connected to the gate terminal of said MOSFET M2, both the source terminals of said MOSFET M1 and said MOSFET M2 connected to a current source respectively, and the common gate terminal further connected to a capacitor Cs and a first switch SW1, wherein the other terminal of said first switch SW1 is connected to an input voltage Vin and a second switch SW2, and the other terminal of said second switch SW2 is connected to the other terminal of said capacitor Cs; a second-stage CMOS circuit composed of a MOSFET M3 and a MOSFET M4, with the source terminal of said MOSFET M3 connected to the source terminal of said MOSFET M4, the gate terminal of said MOSFET M3 connected to the source terminal of said MOSFET M1, the gate terminal of said MOSFET M4 connected to the source terminal of said MOSFET M2, and the common source terminal further connected to the load to provide an output voltage Vout; and the other first switch SW1, connected between said capacitor and said common source terminal, i.e. Vout; wherein said output voltage Vout is further connected to said common source terminal, forming a feedback loop, so as to reduce the power consumption.

The operation of the circuit shown in FIG. 8A includes Phase 1 mode and Phase 2 mode. In Phase 1 mode, the voltage level starting from the input voltage Vin obtains a voltage rise of Vgs1 through said MOSFET M1 and then obtains a voltage drop of Vgs3 through said MOSFET M3, and the other path results in an output voltage $$Vout=Vin-|Vgs2(t1)|+|Vgs4(t1)|$$

such that the circuit configuration will converge to a value, which is close to Vin. The function of said feedback loop is to keep both of said MOSFET's M1 and M2 in the saturation region. The drain voltage of said MOSFET's M1 and M2 equals to the output voltage Vout, which is very close to Vin, and the gate voltage is equal to Vin, so that said MOSFET's M1 and M2, as a whole, function like a rectifying diode, resulting Vgs=Vds. Therefore, regardless of the input voltage Vin, we have $$|Vgs1|=|Vds1|=|Vgs3|$$

$$|Vgs2|=|Vds2|=|Vgs4|$$

such that the output voltage always follows the input voltage Vin.

Moreover, in Phase 2 mode, the stored difference between the input voltage Vin and the output voltage Vout on said capacitor Cs in Phase 1 mode is added as compensation, so as to obtain a more precise output voltage, such that the deviation due to the variation of threshold voltage can be eliminated and the output uniformity can thus be improved.

As shown in FIG. 8A, said CMOS circuits can be implemented by using p-MOSFET's as said MOSFET M1 and said MOSFET M4, and n-MOSFET's as said MOSFET M2 and said MOSFET M3.

Figure 8B:
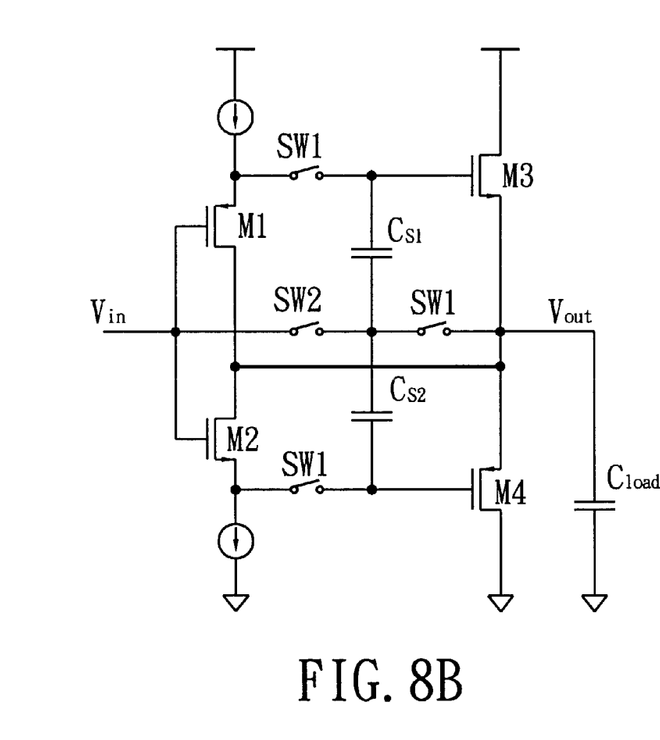
FIG. 8B is a schematic circuit diagram of a source follower in accordance with the fourth embodiment of the present invention, corresponding to the source follower shown in FIG. 7B.

Please further refer to FIG. 8B, which is a schematic circuit diagram of a source follower in accordance with the fourth embodiment of the present invention, corresponding to the source follower shown in FIG. 7B. Said source follower is a source follower with Vgs compensation, offset voltage cancellation, enhanced speed and low power consumption, which comprises: a first-stage CMOS circuit composed of a MOSFET M1 and a MOSFET M2, with the gate terminal of said MOSFET M1 connected to the gate terminal of said MOSFET M2, both the source terminals of said MOSFET M1 and said MOSFET M2 connected to a current source respectively, the common gate terminal further connected to the input voltage Vin, and furthermore, the drain terminal of said MOSFET M1 connected to the drain terminal of said MOSFET M2; a second-stage CMOS circuit composed of a MOSFET M3 and a MOSFET M4, with the source terminal of said MOSFET M3 connected to the source terminal of said MOSFET M4, the gate terminal of said MOSFET M3 connected to a first switch SW1 and a first capacitor Cs1, the gate terminal of said MOSFET M4 connected to a second capacitor Cs2 and the other first switch SW1, and the common source terminal further connected to the load to provide an output voltage Vout, i.e., a first capacitor Cs1 and a second capacitor Cs2 being serially connected between said MOSFET M3 and said MOSFET M4.

Said source follower further comprises a plurality of first switches SW1's, for example, three first switches as shown in FIG. 8B, wherein a first switch S1 is connected between the source terminal of said MOSFET M1 and the gate terminal of said MOSFET M3, another first switch S1 is connected between the source terminal of said MOSFET M2 and the gate terminal of said MOSFET M4, and the other first switch SW1 is connected between the common terminal of said capacitors Cs1 and Cs2 and the output voltage Vout; a second switch SW2, connected between the common terminal of said capacitors Cs1 and Cs2 and the input voltage Vin; and two capacitors Cs1 and Cs2, serially connected between said MOSFET M3 and said MOSFET M4; wherein said output voltage Vout is further connected to said common source terminal, forming a feedback loop, so as to reduce the power consumption.

Furthermore, as shown in FIG. 8B, said CMOS circuits can be implemented by using p-MOSFET's as said MOSFET M1 and said MOSFET M4, and n-MOSFET's as said MOSFET M2 and said MOSFET M3.

Compared to conventional operational amplifiers, the circuit configurations as disclosed in FIG. 8A and FIG. 8B have advantages such as smaller die area and lower power consumption.

As discussed so far, in accordance with the present invention, there is provided a source follower with Vgs compensation, such that the output voltage precisely follows the input voltage by various arrangements of MOSFET's, switches, and capacitors. Such a source follower can be used in the driver circuit for a liquid crystal display (LCD). Consequently, the present invention has been examined to be progressive and has great potential in commercial applications.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A source follower with Vgs compensation and offset voltage cancellation, comprising:

a CMOS circuit having a MOSFET M1 and a MOSFET M2, the drain terminal of the MOSFET M1 being connected with a supply voltage, and the drain terminal of the MOSFET M2 being connected with ground, the gate terminal of the MOSFET M1 being connected with a capacitor Cs, and the gate terminal of the MOSFET M2 being connected with a terminal of a first switch SW1, the other terminal of the first switch SW1 being connected with an input voltage Vin and a second switch SW2, the source terminal of the MOSFET M1 being connected with a first constant current source and the gate terminal of the MOSFET M2, the source terminal of the MOSFET M2 being connected with a second constant current source and a load to provide an output voltage Vout, a third switch SW1 being provided between the output voltage Vout and the capacitor Cs, one terminal of the capacitor Cs being connected with the first switch SW1 and the other terminal of the capoacitor Cs being connected with the second switch SW2 and the first switch SW1;

wherein the output voltage Vout can be obtained when the following steps are completed in sequence:
a. the first switch SW1 and the third switch SW1 are switched on while the second switch SW2 is switched off;
b. the second switch SW2 is switched on while first switch SW1 and the third switch SW1 are switched off.

2. The source follower with Vgs compensation and offset voltage cancellation as recited in claim 1, wherein said said CMOS circuit operates in Phase 1 mode (at time t1), wherein the voltage level starting from the input voltage Vin obtains a voltage drop of Vgs1 through said MOSFET M1 and then obtains a voltage rise of Vgs2 through said MOSFET M2, resulting in an output voltage of Vout=Vin+|Vgs1(t1)|+|Vgs2(t1)| and a voltage across the two terminals of said capacitor of

VCs=|Vgs1(t1)|−|Vgs2(t1)|.

3. The source follower with Vgs compensation and offset voltage cancellation as recited in claim 1, wherein said CMOS circuit operates in Phase 2 mode (at time t2), wherein the input voltage Vin is connected to one terminal of said capacitor, resulting in an output voltage of Vout=Vin+(|Vgs1(t1)|−|Vgs2(t1)|)−|Vgs1(t2)|+|Vgs2(t2)|, which is very close to Vin.

4. The source follower with Vgs compensation and offset voltage cancellation as recited in claim 1, wherein said CMOS circuit is implemented by using an n-MOSFET as said MOSFET M1 and a p-MOSFET as said MOSFET M2.

5. The source follower with Vgs compensation and offset voltage cancellation as recited in claim 1, wherein said CMOS circuit is implemented by using a p-MOSFET as said MOSFET M1 and an n-MOSFET as said MOSFET M2.

6. A source follower with Vgs compensation, offset voltage cancellation and enhanced speed, comprising:
a first-stage CMOS circuit having a MOSFET M1 and a MOSFET M2, the drain terminal of the MOSFET M1 being connected to ground, and the drain terminal of the MOSFET M2 being connected with supply voltage, the gate terminal of the MOSFET M1 being connected with the gate terminal of the MOSFET M2, the source terminal of the MOSFET M1 being connected with a first current source, and the source terminal of the MOSFET M2 being connected with a second current source, the common gate terminal of the MOSFET M1 being connected with one terminal of a capacitor Cs, and the common gate terminal of the MOSFET M2 being connected with one terminal of a first switch SW1, the other terminal of the first switch SW1 being connected with an input voltage Vin and one terminal of a second switch SW2, the other terminal of the second switch SW2 being connected with the other terminal of the capacitor Cs, and
a second-stage CMOS circuit having a MOSFET M3 and a MOSFET M4, the drain terminal of the MOSFET M3 being connected with a supply voltage, and the drain terminal of the MOSFET M4 being connected with ground, the source terminal of the MOSFET M3 being connected with the source terminal of the MOSFET M4, the gate terminal of the MOSFET M3 being connected with the source terminal of the MOSFET M1, and the gate terminal of the MOSFET M4 being connected with the source terminal of the MOSFET M2, the common source terminal of the MOSFET M3 and the MOSFET M4 being connected with a load to provide an output voltage Vout, the third switch SW1 being provided between the capacitor Cs and the common source terminal of the MOSFET M3 and the MOSFET M4, which provides an output voltage Vout across a load;
wherein the output voltage Vout can be obtained when the following steps are completed in sequence:
a. the first switch SW1 and the third switch SW1 are switched on while the second switch SW2 is switched off;
b. the second switch SW2 is switched on while first switch SW1 and the third switch SW1 are switched off.

7. The source follower with Vgs compensation, offset voltage cancellation and enhanced speed as recited in claim 6, wherein said CMOS circuits operate in Phase 1 mode (at time t1), wherein the voltage level starting from the input voltage Vin obtains a voltage rise of Vgs1 through said MOSFET M1 and then obtains a voltage drop of Vgs3 through said MOSFET M3, and the other path results in an output voltage of Vout=Vin−|Vgs2(t1)|+|Vgs4(t1)| such that the circuit configuration will converge to a value, which is close to Vin.

8. The source follower with Vgs compensation, offset voltage cancellation and enhanced speed as recited in claim 6, wherein said CMOS circuits operate in Phase 2 mode (at time t2), wherein the stored difference between the input voltage Vin and the output voltage Vout on said capacitor Cs in Phase 1 mode is added as compensation, so as to obtain a more precise output voltage, such that the deviation due to the variation of threshold voltage can be eliminated and the output uniformity can thus be improved.

9. The source follower with Vgs compensation, offset voltage cancellation and enhanced speed as recited in claim 6, wherein said CMOS circuits are implemented by using p-MOSFET's as said MOSFET M1 and said MOSFET M4, and n-MOSFET's as said MOSFET M2 and said MOSFET M3.

10. A source follower with Vgs compensation, offset voltage cancellation, enhanced speed and low power consumption, comprising:
a first-stage CMOS circuit having a MOSFET M1 and a MOSFET M2, the gate terminal of the MOSFET M1 being connected with the gate terminal of the MOSFET M2, the source terminal of the MOSFET M1 being connected with a first current source, and the source terminal of the MOSFET M2 being connected with a second current source, the common gate terminal being connected with a capacitor Cs and one terminal of a first switch SW1, the other terminal of the first switch SW1 being connected with an input voltage Vin and one terminal of a second switch SW2, the other terminal of the second switch SW2 being connected with the other terminal of the capacitor Cs; and
a second-stage CMOS circuit having a MOSFET M3 and a MOSFET M4, the source terminal of the MOSFET M3 being connected with the source terminal of the MOSFET M4, the drain terminal of the MOSFET M3 being connected to a supply voltage, and the drain terminal of the MOSFET M4 being connected with ground, the gate terminal of the MOSFET M3 being connected with the source terminal of the MOSFET M1, and the gate terminal of the MOSFET M4 being connected with the source terminal of the MOSFET M2, the common source terminal of the MOSFET M3 and the MOSFET M4 being connected with the common drain terminal of the MOSFET M1 and the MOSFET M2 to provide an output voltage Vout across a load, the third switch SW1 being connected between the capacitor Cs and the common source terminal of the MOSFET M3 and the MOSFET M4, the output voltage Vout being connected with the common source terminal, forming a feedback loop, so as with reduce the power consumption;

wherein the output voltage Vout can be obtained when the following steps are completed in sequence:
- a. the first switch SW1 and the third switch SW1 are switched on while the second switch SW2 is switched off;
- b. the second switch SW2 is switched on while the first switch SW1 and the third switch SW1 are switched off.

11. The source follower with Vgs compensation, offset voltage cancellation, enhanced speed and low power consumption as recited in claim 10, wherein the CMOS circuits operate in Phase 1 mode (at time t1), wherein the voltage level starting from the input voltage Vin obtains a voltage rise of Vgs1 through the MOSFET M1 and then obtains a voltage drop of Vgs3 through the MOSFET M3, and the other path results in an output voltage of $$Vout = Vin - |Vgs2(t1)| + |Vgs4(t1)|$$

such that the circuit configuration will converge to a value, which is close to Vin; wherein the function of the feedback loop is to keep both of the MOSFET's M1 and M2 in the saturation region, and the drain voltage of the MOSFET's M1 and M2 equals to the output voltage Vout, which is very close to Vin; and wherein the gate voltage is equal to Vin, so that the MOSFET's M1 and M2, as a whole, function like a rectifying diode, resulting Vgs=Vds; regardless of the input voltage Vin, $$|Vgs1| = |Vds1| = |Vgs3|$$

$$|Vgs2| = |Vds2| = |Vgs4|$$

such that the output voltage always follows the input voltage Vin.

12. The source follower with Vgs compensation, offset voltage cancellation, enhanced speed and low power consumption as recited in claim 10, wherein said CMOS circuits operate in Phase 2 mode (at time t2), wherein the stored difference between the input voltage Vin and the output voltage Vout on said capacitor Cs in Phase 1 mode is added as compensation, so as to obtain a more precise output voltage, such that the deviation due to the variation of threshold voltage can be eliminated and the output uniformity can thus be improved.

13. The source follower with Vgs compensation, offset voltage cancellation, enhanced speed and low power consumption as recited in claim 10, wherein the CMOS circuits are implemented by using p-MOSFET's as said MOSFET M1 and said MOSFET M4, and n-MOSFET's as said MOSFET M2 and said MOSFET M3.

* * * * *